(12) United States Patent
Umemura

(10) Patent No.: US 7,215,029 B1
(45) Date of Patent: May 8, 2007

(54) MULTILAYER INTERCONNECTION STRUCTURE OF A SEMICONDUCTOR

(75) Inventor: Eiichi Umemura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/225,351

(22) Filed: Jan. 5, 1999

(30) Foreign Application Priority Data

Oct. 6, 1998  (JP) ........................... 10-284058

(51) Int. Cl.
*H01L 23/12* (2006.01)

(52) U.S. Cl. .................. 257/765; 257/758; 257/762; 257/767; 257/771; 257/774; 257/775

(58) Field of Classification Search ............. 257/758, 257/762, 765, 767, 771, 774, 775
See application file for complete search history.

(56) References Cited

U.S. PATENT DOCUMENTS 5,459,353 A * 10/1995 Kanazawa .................. 257/751
5,763,954 A * 6/1998 Hyakutake .................. 257/774
5,895,265 A * 4/1999 Inoue et al. ................. 438/643

FOREIGN PATENT DOCUMENTS

JP   405152445 A  *  6/1993
JP   409219381 A  *  8/1997

OTHER PUBLICATIONS

C-K, Hu et al., "Electromigration in two-level interconnect structures with Al alloy lines and W studs," J. Appl. Phys. 72 (1), Jul. 1, 1992, pp. 291–293.

* cited by examiner

*Primary Examiner*—Eddie Lee
*Assistant Examiner*—Matthew E. Warren
(74) *Attorney, Agent, or Firm*—Jones Volentine, PLLC

(57) ABSTRACT

In order to solve the aforementioned problems, the present-invention provides a semiconductor device having a multilayer interconnection structure, wherein an upper interconnection comprises a first metal layer composed of an aluminum alloy, which is formed over a lower interconnection, and a second metal layer formed over the first metal layer and composed of an aluminum alloy formed as a film at a temperature higher than that for the first metal layer. Another invention provides a semiconductor device having a multilayer interconnection structure, wherein a metal region composed of a metal different from an aluminum alloy is formed in a portion spaced by a predetermined distance in an extending direction of an upper interconnection from an end of a via hole defined in the upper interconnection composed of the aluminum alloy, which is electrically connected to a lower interconnection through the via hole.

14 Claims, 7 Drawing Sheets

MULTILAYER INTERCONNECTION STRUCTURE OF A SEMICONDUCTOR

BACKGROUND OF THE INVENTION

1. Field of the Invention

This invention relates to a semiconductor device, and particularly to an improvement in reliability of a multilayer interconnection structure which connects between an upper interconnection and a lower interconnection by a via hole or the like.

2. Description of the Related Art

In a semiconductor process for a multilayer interconnection structure to which a flattening technique is essential, a high-temperature film-forming technique used for aluminum, e.g., a technique for embedding a high melting-point metal like tungsten (W) has been adopted to implement the embedding of a contact hole or via hole. The aluminum high-temperature film-forming technique is one wherein, for example, titanium (Ti) is formed as a reactive layer for increasing fluidity for aluminum after a via hole has been defined in an interlayer insulating film formed over a lower interconnection, and an aluminum alloy with aluminum as a principal component is next formed at a high temperature. According to the high melting-point metal embedding technique, for example, titanium nitride (TiN) is formed as an adhesion layer composed of a high melting-point metal W after a via hole has been defined in an interlayer insulating film formed on a lower interconnection and W is next formed by CVD or the like. Thereafter, tungsten is left within the via hole alone by etchback or the like to form an aluminum alloy as a film. Electromigration in the aluminum alloy and embedded tungsten has been introduced in, for example, the paper:[Electromigration in two-level interconnect structures with Al alloy lines and W studs (1992 American Institute of Physics. VOL. 72. NO. 1, July 1992)], etc.

However, the electromigration in the conventional structure is rate-controlled by interconnections on the high-potential side. When a lower interconnection is biased to negative polarity and an upper interconnection is biased to positive polarity, electrons pass through a via hole so as to move from the lower interconnection to the upper interconnection. As a result, moving start points of aluminum atoms are limited to the via hole and hence aluminum at an end of the upper interconnection on the high-potential side will disappear, thus causing a void. This phenomenon occurs even in a structure wherein no aluminum atoms migrate between an upper interconnection and a lower interconnection as in the high melting-point metal embedded-type structure. However, the phenomenon remarkably occurs in the high melting-point metal embedded-type structure and the life of electromigration becomes extremely short.

When the upper interconnection comprised of the aluminum alloy is formed at a temperature higher than a temperature for allowing aluminum to have fluidity in the multilayer interconnection structure, aluminum atoms move backward more remarkably. Thus, when such a case occurs, the life of electromigration becomes shorter and the allowable current density of each interconnection is less reduced.

SUMMARY OF THE INVENTION

With the foregoing in view, it is therefore an object of the present invention to provide a high-reliable semiconductor device capable of increasing an electromigration life of an upper interconnection electrically connected to a lower interconnection through a via hole.

According to one aspect of this invention, for achieving the above object, there is provided a semiconductor device having a multilayer interconnection structure, comprising:

an upper interconnection, the upper interconnection comprising,
a first metal layer comprised of an aluminum alloy, which is formed over a lower interconnection, and
a second metal layer formed over the first metal layer and comprised of an aluminum alloy formed as a film at a temperature higher than that for the first metal layer.

According to another aspect of this invention, there is provided a semiconductor device having a multilayer interconnection structure, wherein a metal region composed of a metal different from an aluminum alloy is formed in a portion spaced by a predetermined distance in an extending direction of an upper interconnection from an end of a via hole defined in the upper interconnection comprised of an aluminum alloy, which is electrically connected to a lower interconnection through the via hole.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described in detail with reference to the accompanying drawings.

Figure 1:
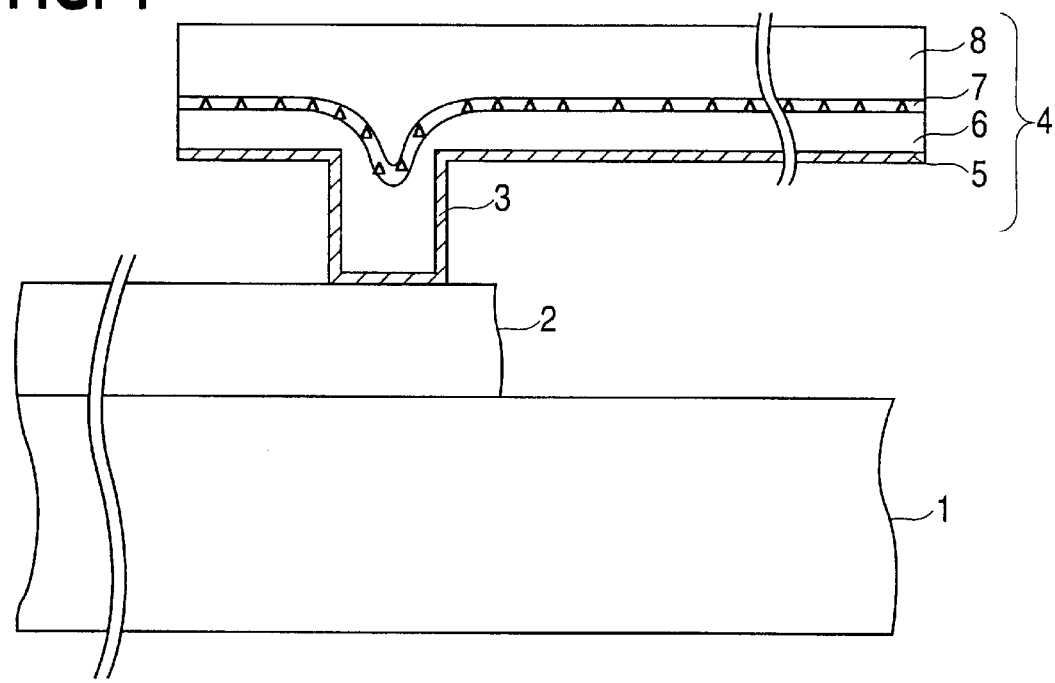
FIG. 1 is an explanatory view showing a first embodiment of the present invention.

First Embodiment:

FIG. 1 is an explanatory view showing a first embodiment of the present invention. A lower interconnection 2 and an upper interconnection 4 formed over a semiconductor substrate 1 are electrically connected to each other through a via hole 3. The lower interconnection 2 is comprised of a layered film composed of an aluminum alloy with aluminum as a principal component and a high melting-point metal, a single-layered film composed of a high melting-point metal alone, or a layered film thereof. The upper interconnection 4 is comprised of a structure in which a high melting-point metal film 5, an aluminum alloy film 6, a high melting-point metal film 7 and an aluminum alloy film 8 are successively stacked on one another. The aluminum alloy film 6 is formed at a temperature of 300° C. or less, whereas the aluminum alloy film 8 is formed at a temperature higher than 300° C. corresponding to a temperature at which aluminum is allowed to have fluidity. Sputtering, CVD, plating or the like is used as a method for manufacturing these metal films.

Figure 2:
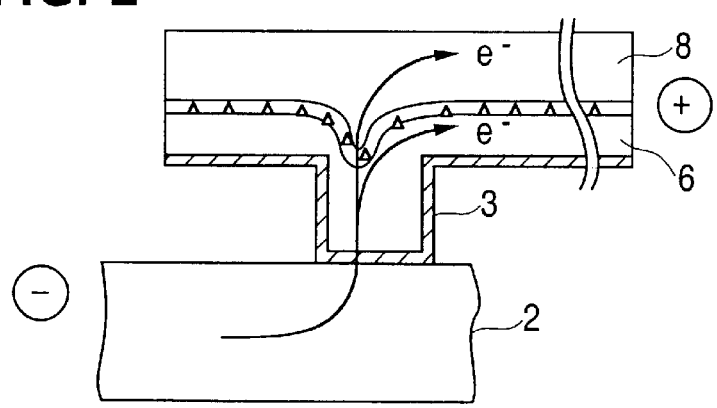
FIG. 2 is an explanatory view illustrating an initial state of electromigration developed in the first embodiment of the present invention.
Figure 3:
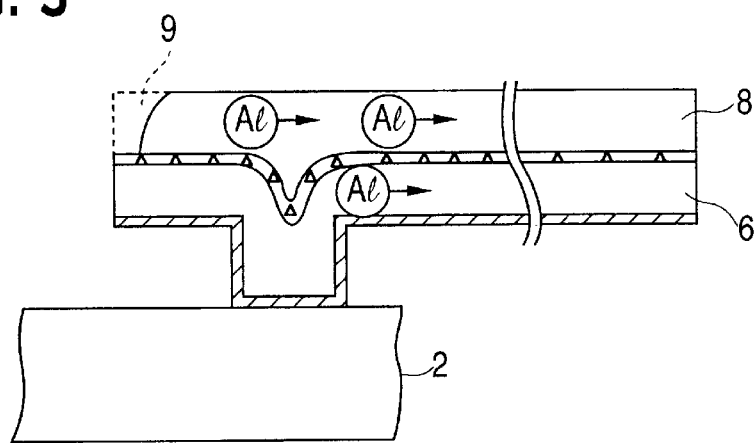
FIG. 3 is an explanatory view depicting a middle state of electromigration developed in the first embodiment of the present invention.
Figure 4:
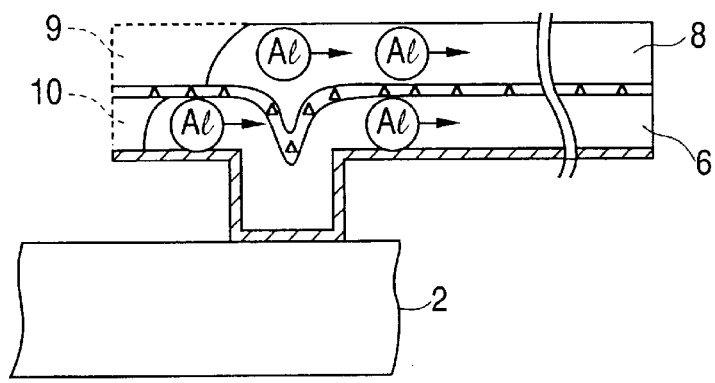
FIG. 4 is an explanatory view showing a further progressive state of electromigration produced in the first embodiment of the present invention.

A description will next be made of the disappearance of aluminum due to electromigration in the multilayer interconnection structure shown in FIG. 1. FIGS. 2, 3 and 4 are respectively explanatory views showing developed or progressive states of electromigration. FIG. 2 is an explanatory view showing an initial state of electromigration. When a low potential is applied to the lower interconnection 2 and a high potential is applied to the upper interconnection 4, electrons, which will cause electromigration, flow from the lower interconnection 2 to the upper interconnection 4 through the via hole 3. A current is principally diverted to the aluminum alloy films 6 and 8. If, at this time, the aluminum alloy films 6 and 8 are equal to each other in thickness, then the current is substantially equally separated into them.

FIG. 3 is an explanatory view showing a middle state of electromigration. With the progress of electromigration, aluminum first begins to disappear at an end of the aluminum alloy film 8 so that a void 9 is formed. FIG. 4 shows a further progressive state of electromigration. In FIG. 4, aluminum begins to disappear even at an end of the aluminum alloy film 6 with being delayed with respect to the aluminum alloy film 8 so that a void 10 is formed. At this time, the void 9 is further growing.

According to the first embodiment of the present invention as described above, since the upper interconnection 4 is formed by the layered structure of the aluminum alloy films 6 and 8 different in aluminum disappearance velocity from each other due to electromigration, the time taken for aluminum to disappear at the upper interconnection 4 will increase. Thus, the life of electromigration can be extended.

Figure 5:
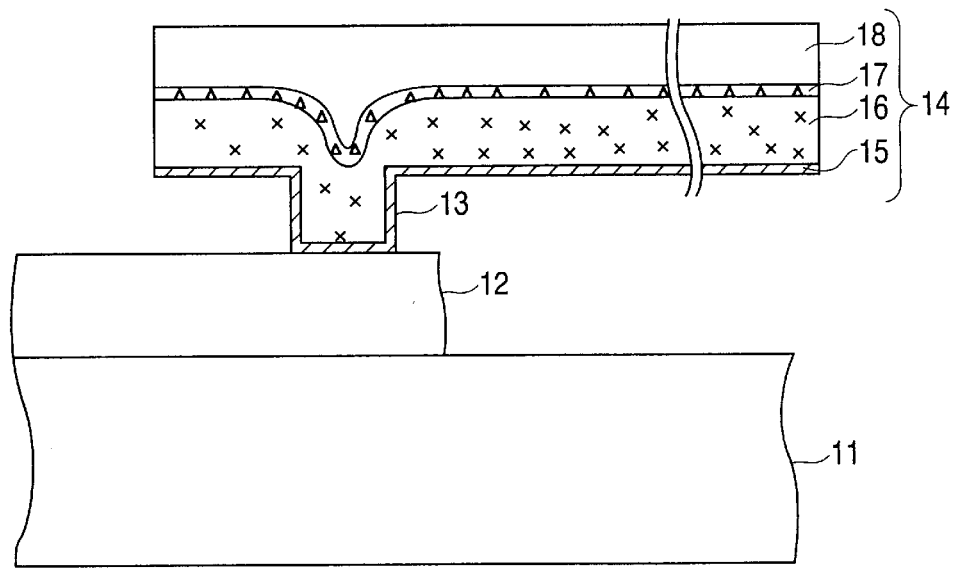
FIG. 5 is an explanatory view illustrating a second embodiment of the present invention.

Second Embodiment:

FIG. 5 is an explanatory view showing a second embodiment of the present invention. A lower interconnection 12 and an upper interconnection 14 formed over a semiconductor substrate 11 are electrically connected to each other through a via hole 13. The lower interconnection 12 is comprised of a layered film composed of an aluminum alloy with aluminum as a principal component and a high melting-point metal, a single-layered film composed of a high melting-point metal alone, or a layered film composed thereof. The-upper interconnection 14 is comprised of a structure in which a high melting-point metal film 15, a metal film (copper film in the present embodiment) 16 having resistance lower than that of an aluminum alloy film, a high melting-point metal film 17 and an aluminum alloy film 18 are successively stacked on one another. Another reason why the copper film 16 has been selected, is also that the copper film is superior to the aluminum alloy film in electromigration resistance. The aluminum alloy film 18 is formed at a temperature higher than 300° C. corresponding to a temperature at which aluminum is allowed to have fluidity. Sputtering, CVD, plating or the like is used as a method for manufacturing these metal films.

A description will next be made of the disappearance of aluminum due to electromigration in a multilayer interconnection structure shown in FIG. 5. Incidentally, a progressive state of electromigration although not shown in the drawing is identical to that developed in the first emodiment except that the amounts of currents separated into the copper film 16 and the aluminum alloy film 18 differ from each other. When a low potential is applied to the lower interconnection 12 and a high potential is applied to the upper interconnection 14, electrons, which will cause electromigration, flow from the lower interconnection 12 to the upper interconnection 14 through the via hole 13. The current is principally diverted to the copper film 16 and the aluminum alloy film 18. If, at this time, the copper film 16 and the aluminum alloy film 18 are substantially equal to each other in thickness, then more current flows into the copper film 16. This is because when the resistance of the copper film 16 is compared with that of the aluminum alloy film 18, the copper film 16 is lower than that of the aluminum alloy film 18 in resistance.

With the progress of electromigration, aluminum first begins to disappear at an end of the aluminum alloy film 18 so that an unillustrated void is formed. With further progress of electromigration, copper begins to disappear at an end of the copper film 16 with being delayed with respect to the aluminum alloy film 18 so that an unillustrated void is formed. At this time, the void formed in the aluminum alloy film 16 falls into further growth.

As described even previously, the current is principally shunted or diverted to the copper film 16 and the aluminum alloy film 18. The shunt ratio between the copper film 16 and the aluminum alloy film 18 is determined according to the resistances and film-thicknesses of the two. When the copper film 16 lower than the aluminum alloy film 18 in resistance is-set thicker than the aluminum alloy film 18, more current flows through the copper film 16. Thus, since the aluminum alloy film 18 decreases in current density, the time taken for aluminum to disappear due to electromigration can be further increased.

According to the second embodiment of the present invention as described above, since the upper interconnection 14 is formed by the layered structure of the metal film 16 and the aluminum alloy film 18 composed of the materials different in resistance from the aluminum alloy film, the time taken for aluminum to disappear at the upper interconnection 14 will increase. Further, the time taken for aluminum to disappear due to electromigration can be also controlled by suitably selecting the material and thickness or the like of the metal film other than the aluminum alloy film 18 constituting the upper interconnection 14. Thus, the life of electromigration can be extended.

Figure 6:
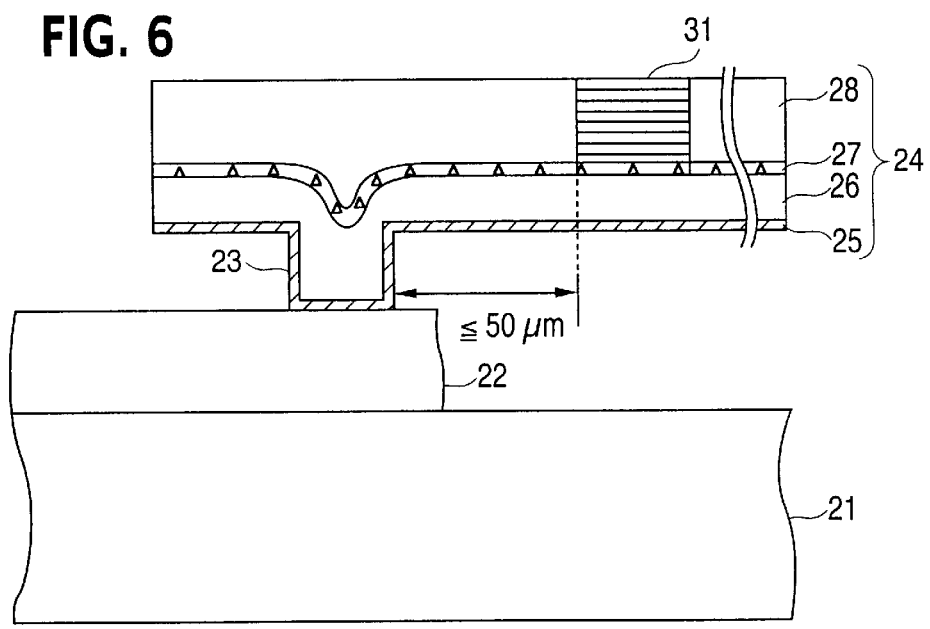
FIG. 6 is an explanatory view depicting a third embodiment of the present invention.

Third Embodiment:

FIG. 6 is an explanatory view showing a third embodiment of the present invention. A lower interconnection 22 and an upper interconnection 24 formed over a semiconductor substrate 21 are electrically connected to each other through a via hole 23. The lower interconnection 22 is comprised of a layered film composed of an aluminum alloy with aluminum as a principal component and a high melting-point metal, a single-layered film composed of a high melting-point metal alone or a layered film composed thereof. The upper interconnection 24 is comprised of a structure in which a high melting-point metal film 25 and an aluminum alloy film 26, and a high melting-point metal film 27 and an aluminum alloy film 28 are successively stacked on one another. The aluminum alloy film 26 is formed at a temperature of less than or equal to 300° C., whereas the aluminum alloy film 28 is formed at a temperature higher than 300° C. corresponding to a temperature at which aluminum is allowed to have fluidity. The structure formed till here is the same to that employed in the first embodiment.

In the present embodiment, a metal region 31 lower than the aluminum alloy in resistance is formed at a portion spaced by a predetermined distance in the extending direction of the upper interconnection 24 from an end of the via hole 23 defined in the aluminum alloy film 28. The metal region 31 lower than the aluminum alloy in resistance is a copper region 31, for example and is formed within 50 μm from the end of the via hole 23. Sputtering, CVD, plating or the like is used as a method for manufacturing these metal films and the metal region.

In the case of the interconnection composed of the aluminum alloy, the difference in density between aluminum atoms occurs as the aluminum atoms move due to electromigration. A void will grow in a non-dense or coarse portion of the interconnection and stress will increase in a dense portion thereof. Further, a force (corresponding to a force opposite to a force under which the aluminum atoms migrate due to electromigration) attempted to relax or relieve the stress occurs in the dense portion. This is called a "backflow phenomenon". When this force and the migration force of the aluminum atoms reach a balanced state, the void stops growing. It is preferable that when the interconnection composed of the aluminum alloy is used, a metal region for inhibiting the migration of the aluminum atoms is formed within 50 μm from the end of the via hole to develop the backflow phenomenon and stop the growth of the void.

Figure 7:
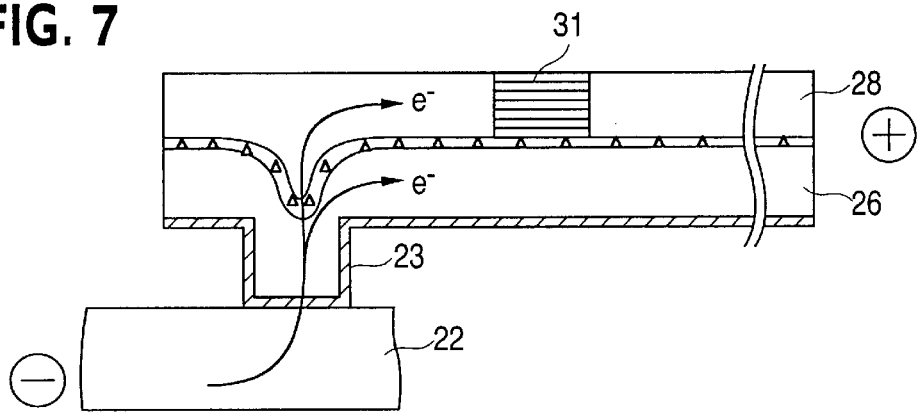
FIG. 7 is an explanatory view showing an initial state of electromigration developed in the third embodiment of the present invention.
Figure 8:
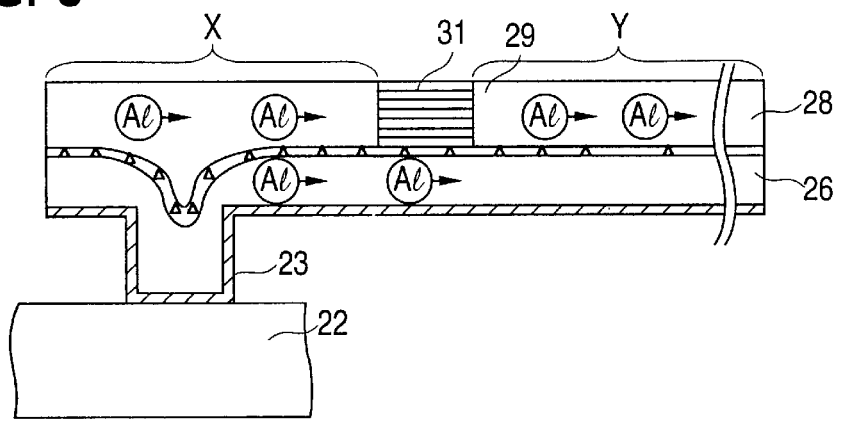
FIG. 8 is an explanatory view illustrating a middle state of electromigration developed in the third embodiment of the present invention.
Figure 9:
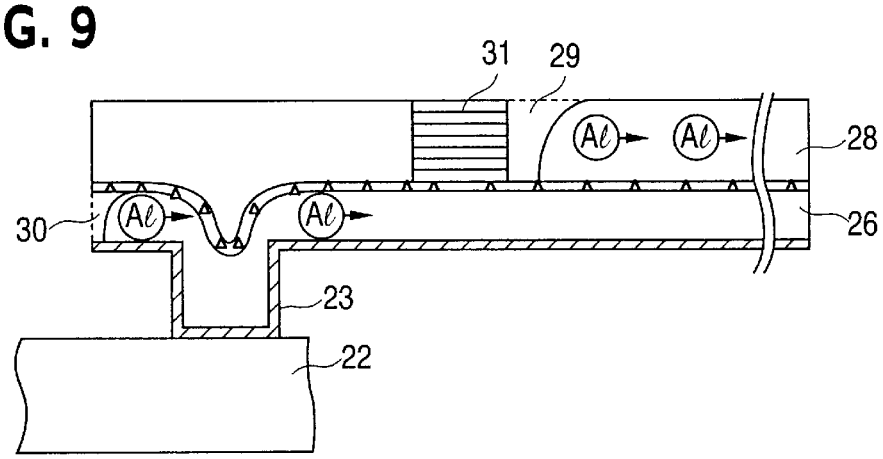
FIG. 9 is an explanatory view depicting showing a further progressive state of electromigration produced in the third embodiment of the present invention.

A description will next be made of the disappearance of aluminum due to electromigration in the multilayer interconnection structure-shown in FIG. 6. FIGS. 7, 8 and 9 are respectively explanatory views showing developed or progressive states of electromigration. FIG. 7 is an explanatory view showing an initial state of electromigration. When a low potential is applied to the lower interconnection 22 and a high potential is applied to the upper interconnection 24, electrons, which will cause electromigration, flow from the lower interconnection 22 to the upper interconnection 24 through the via hole 23. A current is principally diverted to the aluminum alloy films 26 and 28. If, at this time, the aluminum alloy films 26 and 28 are substantially equal to each other in thickness, then the current is substantially equally separated into them.

FIG. 8 is an explanatory view showing a middle state of electromigration. With the progress of electromigration, aluminum atoms will first move in the aluminum alloy film 28. However, the migration of the aluminum atoms is inhibited by the copper region 31 in an X portion and the aluminum begins to disappear in a Y portion. Aluminum begins to disappear from the side of the copper region 31 so that a void 29 is formed. FIG. 9 shows a further progressive state of electromigration. In FIG. 9, aluminum begins to disappear at an end of the aluminum alloy film 26 with being delayed with respect to the aluminum alloy film 28, so that a void 30 is formed. At this time, the void 29 falls into further growth.

According to the third embodiment of the present invention as described above, since the metal region 31 for inhibiting the migration of the aluminum atoms is provided in the aluminum alloy film 28 of the upper interconnection 24, the time taken for aluminum to disappear at the upper interconnection 24 will increase. Thus, the life of electromigration can be extended.

Figure 10:
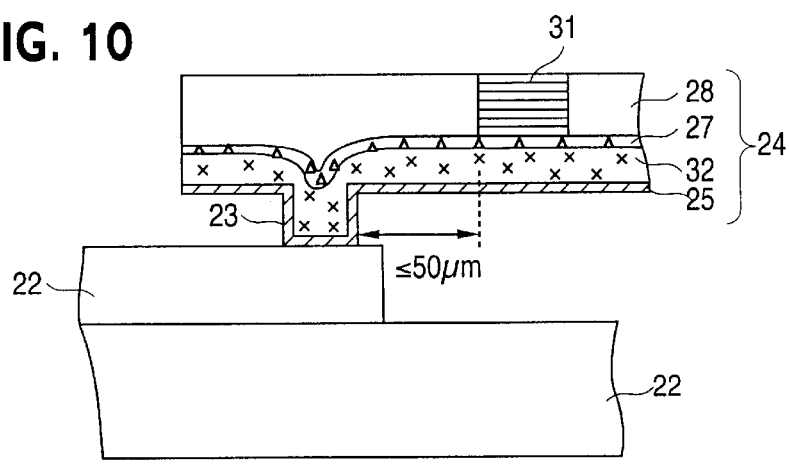
FIG. 10 is an explanatory view showing another modification of the third embodiment of the present invention.

FIG. 10 shows another modification of the third embodiment of the present invention. Its detailed description will be omitted. However, a similar effect can be expected even in a structure in which the aluminum alloy film 26 constituting the upper interconnection 24 is provided as a metal film (e.g. copper film) 32 having resistance lower than that for the aluminum alloy film.

Figure 11:
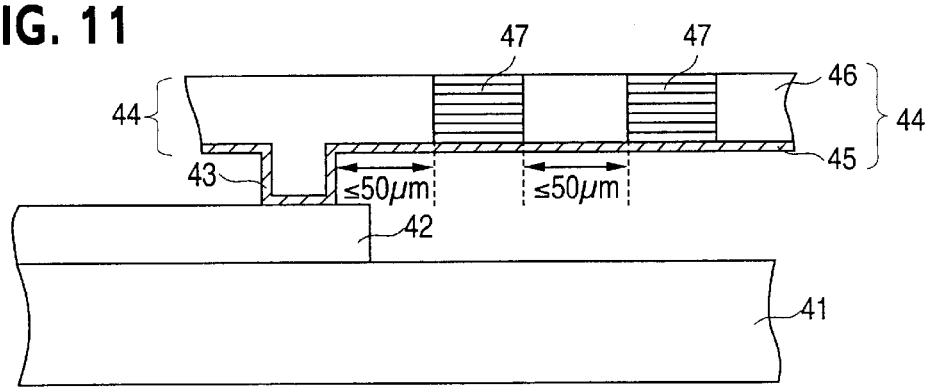
FIG. 11 is an explanatory view illustrating a fourth embodiment of the present invention.

Fourth Embodiment:

FIG. 11 is an explanatory view showing a fourth embodiment of the present invention. A lower interconnection 42 and an upper interconnection 44 formed over a semiconductor substrate 41 are electrically connected to each other through a via hole 43. The lower interconnection 42 is comprised of a layered film composed of an aluminum alloy with aluminum as a principal component and a high melting-point metal, a single-layered film composed of a high melting-point metal alone, or a layered film composed thereof. The upper interconnection 44 is comprised of a structure in which a high melting-point metal film 45 and an aluminum alloy film 46 are stacked on one another. The aluminum alloy film 46 is formed at a temperature higher than 300° C. corresponding to a temperature at which aluminum is allowed to have fluidity. A plurality of metal regions 47 lower than the aluminum alloy in resistance are formed in the aluminum alloy film 46. Each of the metal regions 47 is a copper region 47, for example and is provided within 50 μm from an end of the via hole 43. Further, they are provided at intervals of within 50 μm. Sputtering, CVD, plating or the like is used as a method for manufacturing these mental films and metal regions.

Figure 12:
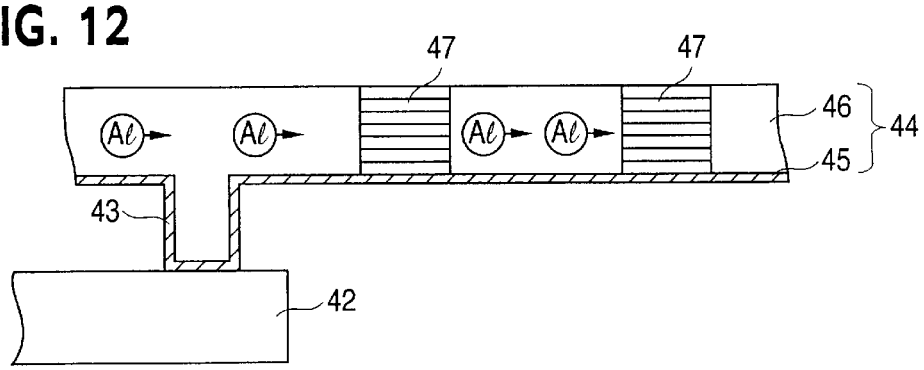
FIG. 12 is an explanatory view depicting a progressive state of electromigration produced in the fourth embodiment of the present invention.

A description will next be made of the disappearance of aluminum due to electromigration. FIG. 12 is an explanatory view showing a developed or progressive state of electromigration. When a low potential is applied to the lower interconnection 42 and a high potential is applied to the upper interconnection 44, electrons, which will cause electromigration, flow from the lower interconnection 42 to the upper interconnection 44 through the via hole 43. With the progress of electromigration, aluminum atoms attempt to migrate in the aluminum alloy film 46. However, the migration of the aluminum atoms is blocked by the copper regions 47 provided in a region for causing a backflow phenomenon and stopping the growth of a void. As a result, no void is produced by electromigration. Thus, the life of electromigration can be expected to be longer.

Figure 13:
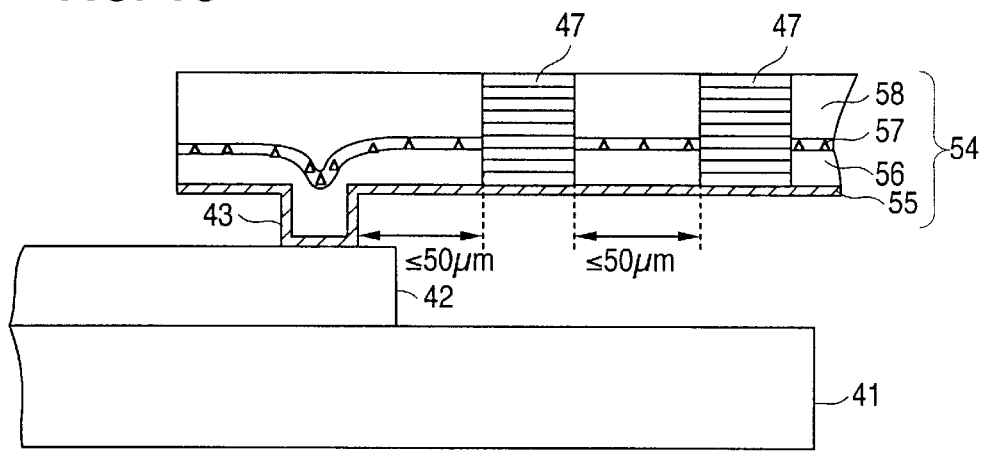
FIG. 13 is an explanatory view showing another modification of the fourth embodiment of the present invention.

FIG. 13 shows another modification of the fourth embodiment of the present invention. An upper interconnection 54 is made up of a structure in which a high melting-point metal film 55, an aluminum alloy film 56, a high melting-point metal film 57 and an aluminum alloy film 58 are successively stacked on a lower interconnection 42. The aluminum alloy film 56 is formed at a temperature of 300° C. or less, whereas the aluminum alloy film 58 is formed at a temperature higher than 300° C. corresponding to a temperature at which aluminum is allowed to have fluidity. A plurality of metal regions 47, which extend through the aluminum alloy film 56, the high melting-point metal film 57 and the aluminum alloy film 58 and are lower than the aluminum alloy in resistance, are formed in the upper interconnection 54. Each of the metal regions 47 is a copper region 47, for example and is provided within 50 μm from an end of a via hole 43. Further, they are provided at intervals of within 50 μm. Even in the case of such a modification, an effect similar to the above can be expected.

Figure 14:
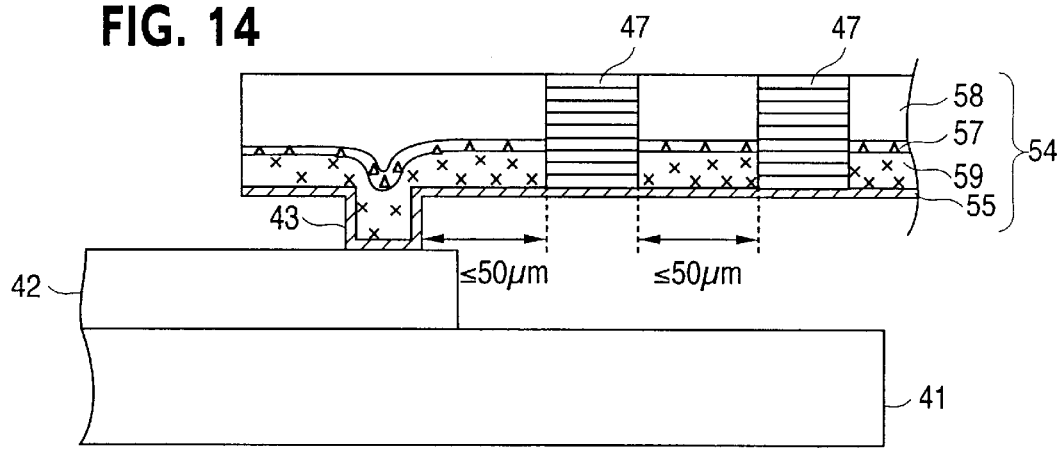
FIG. 14 is an explanatory view illustrating a further modification of the fourth embodiment of the present invention.

FIG. 14 shows a further modification of the fourth embodiment of the present invention. Its detailed description will be omitted. However, a similar effect can be expected even in a structure in which the aluminum alloy film 56 constituting the upper interconnection 54 shown in FIG. 13 is provided as a metal film (e.g. copper film) 59 having resistance lower than that for the aluminum alloy film. In this case, each metal region 47 is formed from a metal material other than copper.

Figure 15:
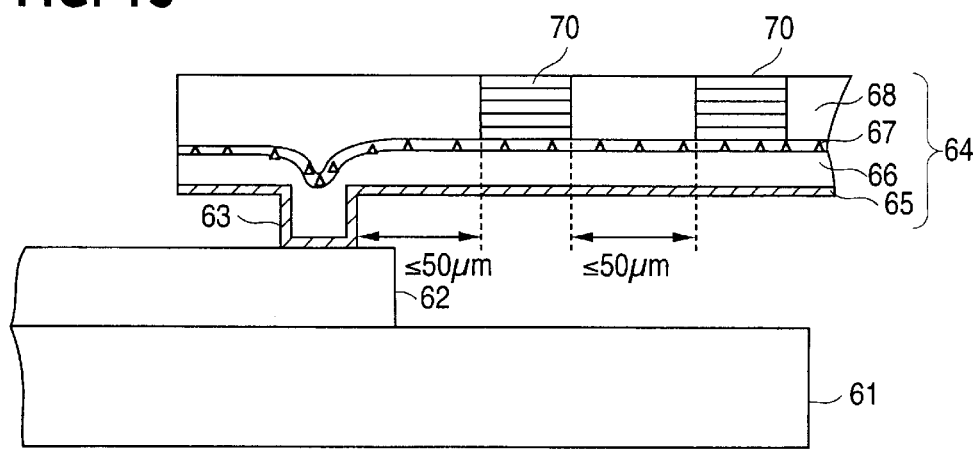
FIG. 15 is an explanatory view depicting a fifth embodiment of the present invention.

Fifth Embodiment:

FIG. 15 is an explanatory view showing a fifth embodiment of the present invention. A lower interconnection 62 and an upper interconnection 64 formed over a semiconductor substrate 61 are electrically connected to each other through a via hole 63. The upper interconnection 64 is comprised of a structure in which a high melting-point metal film 65 and an aluminum alloy film 66, and a high melting-point metal film 67 and an aluminum alloy film 68 are successively stacked on one another. The aluminum alloy film 66 is formed at a temperature of less than or equal to 300° C., whereas the aluminum alloy film 68 is formed at a temperature higher than 300° C. corresponding to a temperature at which aluminum is allowed to have fluidity. A plurality of metal regions 70, which extend through the aluminum alloy film 68 and are lower than the aluminum alloy in resistance, are formed in the upper interconnection 64. Each of the metal regions 70 is a copper region 70, for example and is provided within 50 μm from an end of the via hole 63. Further, they are provided at intervals of within 50 μm.

When a low potential is applied to the lower interconnection 62 and a high potential is applied to the upper interconnection 64 in a manner similar to other embodiments, electrons, which produce electromigration, flow from the lower interconnection 62 to the upper interconnection 64 through the via hole 63. With the progress of electromigration, aluminum atoms first attempt to migrate in the aluminum alloy film 68. However, the migration of the aluminum atoms is blocked by each copper region 70. With further progress of electromigration, aluminum begins to disappear at an end of the aluminum alloy film 66 with being delayed with respect to the aluminum alloy film 68, so that an unillustrated void 30 is formed. Even in the case of such a structure, the life of electromigration can be expected to be long.

Figure 16:
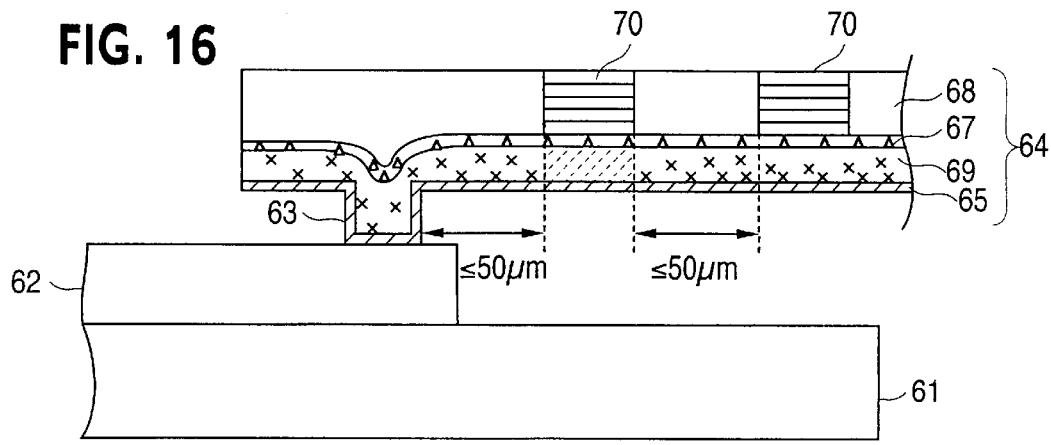
FIG. 16 is an explanatory view showing another modification of the fifth embodiment of the present invention.

FIG. 16 shows another modification of the fifth embodiment of the present invention. Its detailed description will be omitted. However, a similar effect can be expected even in a structure in which the aluminum alloy film 66 constituting the upper interconnection 64 shown in FIG. 15 is provided as a metal film (e.g. copper film) 69 having resistance lower than that for the aluminum alloy film.

According to the semiconductor device of the present invention, as has been described above in detail, an upper interconnection is formed by a structure in which metal films different from each other in the velocity at which aluminum disappears due to electromigration, are stacked on one another. Further, a metal region for inhibiting the migration of aluminum atoms is provided in the upper interconnection. Thus, the life of electromigration can be made long.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device having a multilayer interconnection structure, comprising:
   an upper interconnection electrically connected to a lower interconnection through a via hole, said upper interconnection comprising,
   a first metal layer composed of an aluminum alloy, which is formed over said lower interconnection, and
   a second metal layer formed over said first metal layer and composed of an aluminum alloy formed as a film at a temperature higher than that for said first metal layer; and
   a third metal region different from the aluminum alloy, which is formed in a portion spaced by a predetermined distance in an extending direction of said second metal layer from an end of said via hole defined in said second metal layer.

2. The semiconductor device according to claim 1, wherein said predetermined distance is less than or equal to 50 μm.

3. The semiconductor device according to claim 1, wherein said first metal layer is formed of a metal material lower than said second metal layer in resistance.

4. The semiconductor device according to claims 1 and 3, wherein said third metal region is provided in plural form at predetermined intervals in the extending direction of said second metal layer.

5. The semiconductor device according to claim 4, wherein said each predetermined interval is less than or equal to 50 μm.

6. The semiconductor device according to claim 1, wherein the temperature at which said second metal layer is formed, is a temperature at which aluminum is allowed to have fluidity.

7. The semiconductor device according to claim 6, wherein the temperature at which aluminum is allowed to have fluidity, is a temperature higher than 300° C.

8. The semiconductor device according to claim 1, wherein said first metal layer is substantially identical to or greater than said second metal layer in thickness.

9. The semiconductor device according to claim 1, wherein said first metal layer is formed over said lower interconnection with a first high melting-point metal layer interposed therebetween, and said second metal layer is formed over said first metal layer with a second high melting-point metal layer interposed therebetween.

10. A semiconductor device having a multilayer interconnection structure, wherein a metal region comprised of a metal different from an aluminum alloy is formed in a portion spaced by a predetermined distance in an extending direction of an upper interconnection from an end of a via hole defined in said upper interconnection comprised of an aluminum alloy, which is electrically connected to a lower interconnection through the via hole.

11. The semiconductor device according to claim 10, wherein said predetermined distance is less than or equal to 50 μm.

12. The semiconductor device according to claim 10, wherein said metal region is provided in plural form at predetermined intervals in the extending direction of said upper interconnection.

13. The semiconductor device according to claim 12, wherein said each predetermined interval is less than or equal to 50 μm.

14. A semiconductor device having a multilayer interconnection structure, comprising:

an upper interconnection electrically connected to a lower interconnection through a via hole, said upper interconnection comprising, a first metal layer composed of an aluminum alloy, which is formed over said lower interconnection, and a second metal layer formed over said first metal layer and composed of an aluminum alloy formed as a film at a temperature higher than that for said first metal layer; and a third metal region composed of a metal different from the aluminum alloy, said third metal region being formed in a portion spaced by a predetermined distance in an extending direction of said upper interconnection from an end of said via hole defined therein.

* * * * *